United States Patent
Sun et al.

(10) Patent No.: US 7,895,500 B2
(45) Date of Patent: Feb. 22, 2011

(54) SYSTEMS AND METHODS FOR REDUCED COMPLEXITY LDPC DECODING

(75) Inventors: Guohui Sun, Beijing (CN); Jing Jin, Beijing (CN); Wenbin Yao, Beijing (CN); Hongwen Yang, Beijing (CN)

(73) Assignee: Via Telecom Co., Ltd. (KY)

( * ) Notice: Subject to any disclaimer, the term of this patent is extended or adjusted under 35 U.S.C. 154(b) by 1007 days.

(21) Appl. No.: 11/689,357

(22) Filed: Mar. 21, 2007

(65) Prior Publication Data

US 2008/0052558 A1    Feb. 28, 2008

Related U.S. Application Data

(60) Provisional application No. 60/820,729, filed on Jul. 28, 2006.

(51) Int. Cl.
*H03M 13/00* (2006.01)
(52) U.S. Cl. ........................... 714/758; 714/752
(58) Field of Classification Search ................. 714/752, 714/758
See application file for complete search history.

(56) References Cited

U.S. PATENT DOCUMENTS

| 6,539,367 | B1* | 3/2003 | Blanksby et al. | 706/14 |
| 7,454,685 | B2* | 11/2008 | Kim et al. | 714/758 |
| 7,458,009 | B2* | 11/2008 | Yu et al. | 714/800 |
| 7,747,934 | B2* | 6/2010 | Livshitz | 714/800 |
| 2003/0229843 | A1* | 12/2003 | Yu et al. | 714/794 |
| 2006/0236195 | A1 | 10/2006 | Novichkov et al. | |
| 2008/0104474 | A1* | 5/2008 | Gao et al. | 714/752 |

* cited by examiner

*Primary Examiner*—Sam Rizk
(74) *Attorney, Agent, or Firm*—Baker & McKenzie LLP

(57) ABSTRACT

Systems and methods for generating check node updates in the decoding of low-density parity-check (LDPC) codes use new approximations in order to reduce the complexity of implementing a LDPC decoder, while maintaining accuracy. The new approximations approximate the standard sum-product algorithm (SPA), and can reduce the approximation error of min-sum algorithm (MSA) and have almost the same performance as sum-product algorithm (SPA) under both floating precision operation and fixed-point operation.

22 Claims, 16 Drawing Sheets

SYSTEMS AND METHODS FOR REDUCED COMPLEXITY LDPC DECODING

RELATED APPLICATION INFORMATION

This application claims priority under 35 U.S.C. §119(e) to U.S. Provisional Patent Application Ser. No. 60/820,729, filed Jul. 28, 2006, entitled "Reduced-Complexity Algorithm for Decoding LDPC Codes," which is incorporated herein by reference in its entirety as if set forth in full.

BACKGROUND

1. Field of the Invention

The embodiments described herein are related to methods for Low-Density Parity-Check decoding and more particularly to methods for achieving reduced complexity Low-Density Parity-Check decoders.

2. Background of the Invention

A Low-Density Parity-Check (LDPC) code is an error correcting code that provides a method for transferring a message over a noisy transmission channel. While LDPC techniques cannot guaranty perfect transmission, the probability of lost information can be made very small. In fact, LDPC codes were the first to allow data transmission rates at close to the theoretical maximum, e.g., the Shannon Limit. LDPC techniques use a sparse parity-check matrix, e.g, a matrix populated mostly with zeros, hence the term low-density. The sparse matrix is randomly generated subject to the defined sparsity constraint.

LDPC codes can be defined as both a matrix and a graphical form. An LDPC matrix will have a certain number of rows (M) and columns (N). The matrix can also be defined by the number of 1's in each row ($w_r$) and the number of 1's in each column ($w_c$). For a matrix to be considered low-density the following conditions should be met: $w_c \ll N$ and $w_r \ll M$. An LDPC matrix can be regular or irregular. A regular LDPC matrix, is one in which $w_c$ is constant for every column and $w_r = w_c * (M/N)$ is also constant for every row. If the matrix is low-density but the number of 1's in each row or column is not constant, then such codes are called irregular LDPC code.

It will also be understood that an LDPC code can be graphically defined by its corresponding Tanner graph. Not only do such graphs provide a complete representation of the code, they also help to describe the decoding algorithm as explained in more detail below. A Tanner graph comprises nodes and edges. The nodes are separated into two distinctive sets, or types, and the edges connect the two different types of nodes. The two types of nodes in a Tanner graph are called the variable nodes (v-nodes) and check nodes (c-nodes), or parity nodes. Thus, the Tanner graph will consist of M check nodes (the number of parity bits) and N variable nodes (the number of bits in a code word). A check node will then be connected to a variable node if there is a 1 in the corresponding element of the LDPC matrix.

The number of information bits can be represented as (K). A Generator Matrix ($G_{K \times N}$) can then be defined according to the following:

$c_{N \times 1} = G_{N \times K} d_{K \times 1}$, where $d_{K \times 1}$ = a message or data word, and $c_{N \times 1}$ = a code word.

As can be seen, the code word $c_{N \times 1}$ is generated by multiplying the message by the generator matrix. The subscripts are matrix notation and refer to the number of rows and columns respectfully. Thus, the data word and code word can be represented as single column matrices with K and N rows respectfully.

The parity check Matrix can be defined as $H_{M \times N} c_{N \times 1} = 0$.

Accordingly, FIG. 1 is a diagram illustrating a system 100 that includes a transmitter and a receiver. A portion 102 of the transmitter and a portion 110 of the receiver are shown for simplicity. Referring to FIG. 1, an encoder 104 converts a data word $d_{K \times 1}$ into a code word $c_{N \times 1}$ via application of the generator matrix $G_{K \times N}$. Modulator 106 can be configured to then modulate code word $c_{N \times 1}$ onto a carrier so that the code word can be wirelessly transmitted across channel 108 to the receiver.

In receive portion 110, demodulator 112 can be configured to remove the carrier from the received signal; however, channel 108 will add channel effects and noise, such the signal produced by demodulator 112 can have the form: $r_{N \times 1} = 2/\sigma^2 (1 - 2 c_{N \times 1}) + w_{N \times 1}$, where r is a multilevel signal. As a result of the noise and channel effects, some of data bits d will be lost in the transmission. In order to recover as much of the data as possible, decoder 114 can be configured to use the parity check matrix $H_{M \times N}$ to produce an estimate $d'_{K \times 1}$ of the data that is very close to the original data $d_{K \times 1}$. It will be understood that decoder 114 can be a hard decision decoder or a soft decision decoder. Soft decision decoders are more accurate, but also typically require more resources.

In order to illustrate the operation of LDPC codes, the following example is presented:

$$H_{3 \times 6} = \begin{bmatrix} 1 & 0 & 1 & 0 & 1 & 0 \\ 0 & 1 & 0 & 1 & 0 & 1 \\ 1 & 1 & 0 & 0 & 0 & 1 \end{bmatrix}$$

As can be seen, the example parity check matrix H is low density, or sparse. The first row of matrix H defines the first parity check node, or equation. As can be seen, the first parity check node will check received samples $r_0$, $r_2$, and $r_4$, remembering that r is the multilevel signal produced by demodulator 112 in the receiver. The second parity check node, i.e., the second row of H, checks for received samples $r_1$, $r_3$, and $r_5$, and the third parity check node checks samples $r_0$, $r_1$, and $r_5$. In this example, there are three parity check nodes and six samples. The first and second parity check nodes are considered orthogonal, because they involve mutually exclusive sets of samples.

If it is assumed that K=3 and M=3, then the following is true:

$$H_{3 \times 6} c_{6 \times 1} = 0 \Leftrightarrow H_{3 \times 6} \begin{bmatrix} d_{3 \times 1} \\ p_{3 \times 1} \end{bmatrix} = 0 \Leftrightarrow \begin{bmatrix} 1 & 0 & 1 & 0 & 1 & 0 \\ 0 & 1 & 0 & 1 & 0 & 1 \\ 1 & 1 & 0 & 0 & 0 & 1 \end{bmatrix} \begin{bmatrix} d_0 \\ d_1 \\ d_2 \\ p_0 \\ p_1 \\ p_2 \end{bmatrix} = 0$$

This produces the following equations:

$d_0 + d_2 + p_1 = 0$ $d_1 + p_0 + p_2 = 0$ $d_0 + d_1 + p_2 = 0$

These equations reduce to:

$p_0 = d_0$ $p_1 = d_0 + d_2$ $p_2 = d_0 + d_1$

Thus, for example, if d=[0;1;0], then p=[0;0;1] and c=[0; 1;0;0;0;1].

FIG. 2 is a Tanner Graph illustrating the operation of H in the example above. As can be seen, the graph of FIG. 2 has three parity check nodes 202, 204, and 206, and 6 variable nodes 208, 210, 212, 214, 216, and 218, which correspond to the bits of c. Parity check nodes 202, 204, and 206 are connected with variable nodes 208, 210, 212, 214, 216, and 218, via edges 220, 222, 224, 226, 228, 230, 232, 234, and 236 as dictated by the entries in H. In other words, each edge 220, 222, 224, 226, 228, 230, 232, 234, and 236 should correspond to a 1 in H.

In an LDPC decoder, the operations of the parity check and variable nodes can be implemented by processors. In other words, each parity check node can be implemented by a parity check processor, and each variable check node can be implemented by a variable node processor. An LDPC decoder is then an iterative decoder that implements a message passing algorithm defined by H.

Unfortunately, conventional LDPC decoding techniques result in a high complexity, fully parallel decoder implementations where all the messages to and from all the parity node processors have to be computed at every iteration in the decoding process. This leads to large complexity, increased resource requirements, and increased cost.

Hence, there are many current efforts devoted to reducing the complexity of check node message updating, while keeping the performance loss as small as possible. The most common simplification is the min-sum algorithm (MSA), which has greatly reduced the complexity of check node updates, but incurs a 0.3-0.4 dB degradation in performance relative to standard sum-product algorithm (SPA) check node implementations. To combat this performance degradation, modifications of the MSA using a normalization term and an offset adjustment term have also been proposed. Such solutions do have reduced performance loss compared with the more conventional MSA implementations, but there is still significant performance loss. In addition, two-dimensional MSA schemes have been proposed that can further improve the performance of MSA with some additional complexity. Thus, in conventional implementations, there is a constant trade-off between complexity and performance.

SUMMARY

Systems and methods for generating check node updates in the decoding of low-density parity-check (LDPC) codes are described below. The systems and methods described below use new approximations in order to reduce the complexity of implementing a LDPC decoder, while maintaining accuracy. The new approximations approximate the standard sum-product algorithm (SPA), and can reduce the approximation error of min-sum algorithm (MSA) and has almost the same performance as sum-product algorithm (SPA) under both floating precision operation and fixed-point operation.

In one aspect, a receiver can include a demodulator configured to receive a wireless signal, remove a carrier signal from the wireless signal and produce a received signal, and a Low Density Parity Check (LDPC) processor configured to recover an original data signal from the received signal. The LDPC processor can include a plurality of variable node processors configured to receive the received signal and generate variable messages based on the received signal, and a parity node processor configured to receive the variable messages and generate soft outputs based on the variable messages, the parity node processor configured to implement the following:

$$\lambda_i = -\prod_{j=1, j \neq i}^{n} \text{sgn}(u_j) \times \min\{\ln(A - e^{-|u_i|}), 0\}.$$

The parity node processor can be implemented using either a serial architecture or a parallel architecture.

In another aspect, a parity node processor can include a plurality of input processing blocks configured to receive variable messages in parallel and perform an exponential operation on the variable messages, a summer coupled with the plurality of input processing blocks, the summer configured to sum the outputs from the plurality of input processing blocks, a plurality of adders coupled with the summer and the plurality of input processing blocks, the plurality of adders configured to subtract the outputs of the plurality of input processing blocks from the output of the summer, and a plurality of output processing blocks coupled with the plurality of adders, the plurality of output processing blocks configured to perform a logarithm function on the outputs of the plurality of adders.

In another aspect, a parity node processor can include an input processing block configured to serially receive variable messages and perform an exponential operation on the variable messages, an accumulator coupled with the input processing block, the accumulator configured to accumulate the output of the input processing block, a shift register coupled with the input processing block, the shift register configured to store the variable massages for one clock cycle, an adder coupled with the accumulator and the shift register, the adder configured to subtract the output of the shift register from the output of the accumulator, and an output processing block coupled with the adder, the output processing block configured to perform a logarithm function on the output of the adder.

In still another aspect, a method for processing a received wireless signal can include receiving the wireless signal, removing a carrier signal from the wireless signal to produce a received signal, generating variable messages from the received signal, performing an exponential operation on the variable messages to generate exponential data, summing the exponential data subtracting the variable messages from the summed exponential data to form a difference, and performing a logarithmic operation on the difference.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

In the descriptions that follow, certain example parameters, values, etc., are used; however, it will be understood that the embodiments described herein are not necessarily limited by these examples. Accordingly, these examples should not be seen as limiting the embodiments in any way. Further, the embodiments of an LDPC decoder described herein can be applied to many different types of systems implementing a variety of protocols and communication techniques. Accordingly, the embodiments should not be seen as limited to a specific type of system, architecture, protocol, air interface, etc. unless specified.

Figure 1:
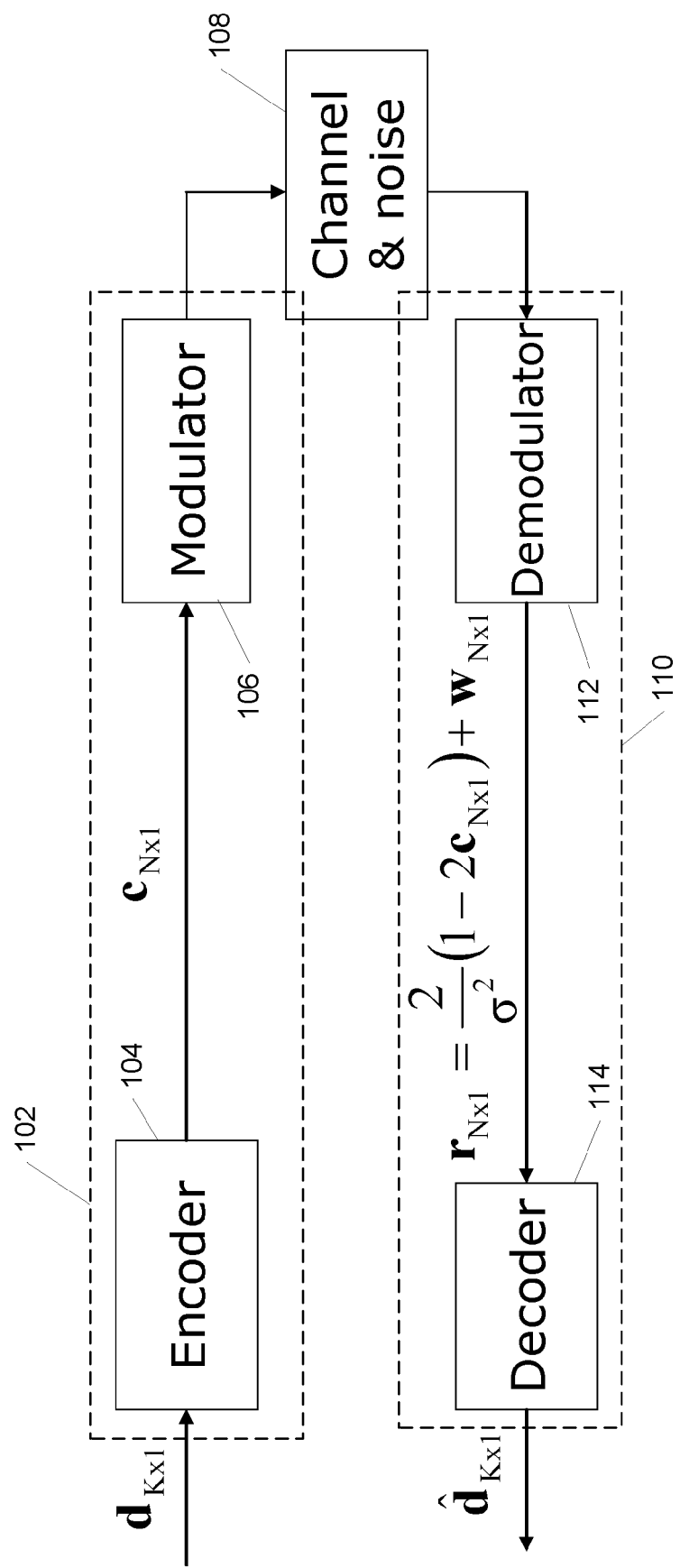
FIG. 1 is a diagram illustrating an example communication system that uses LDPC codes.
Figure 2:
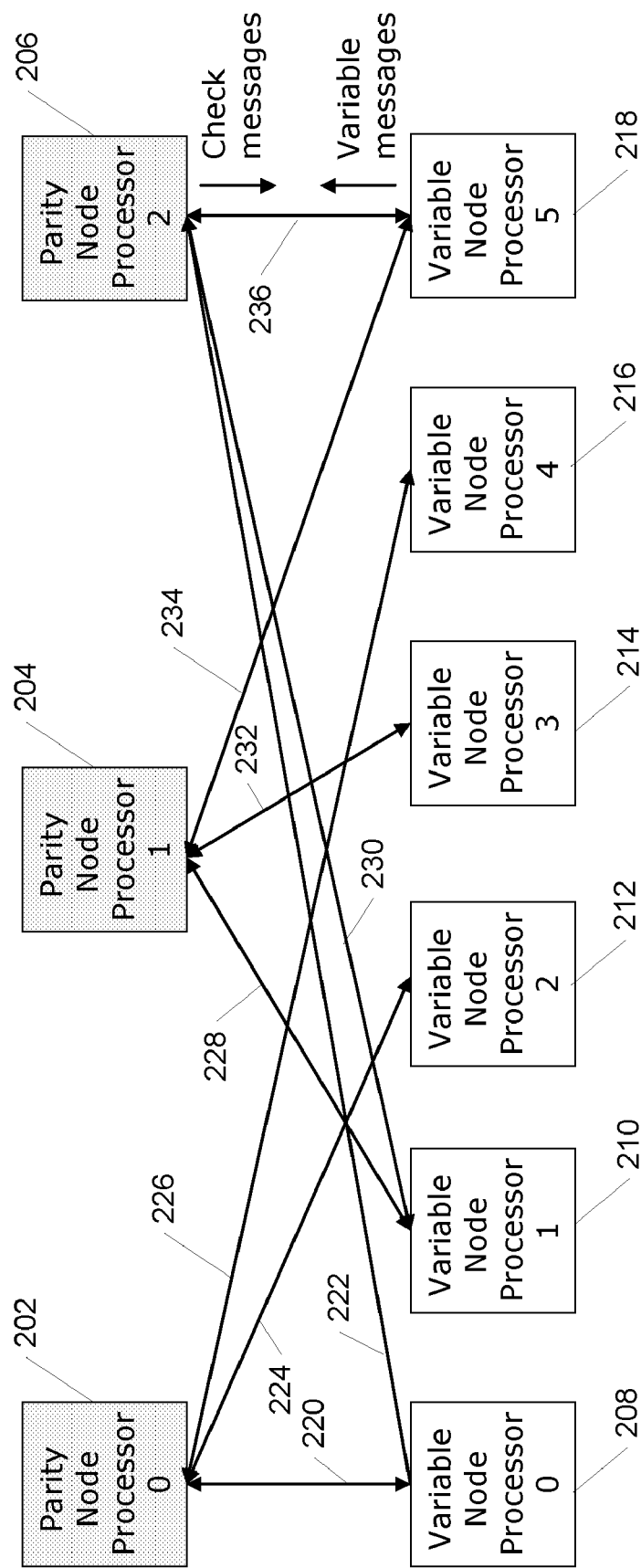
FIG. 2 is a diagram illustrating the operation of an exemplary parity check matrix.
Figure 3:
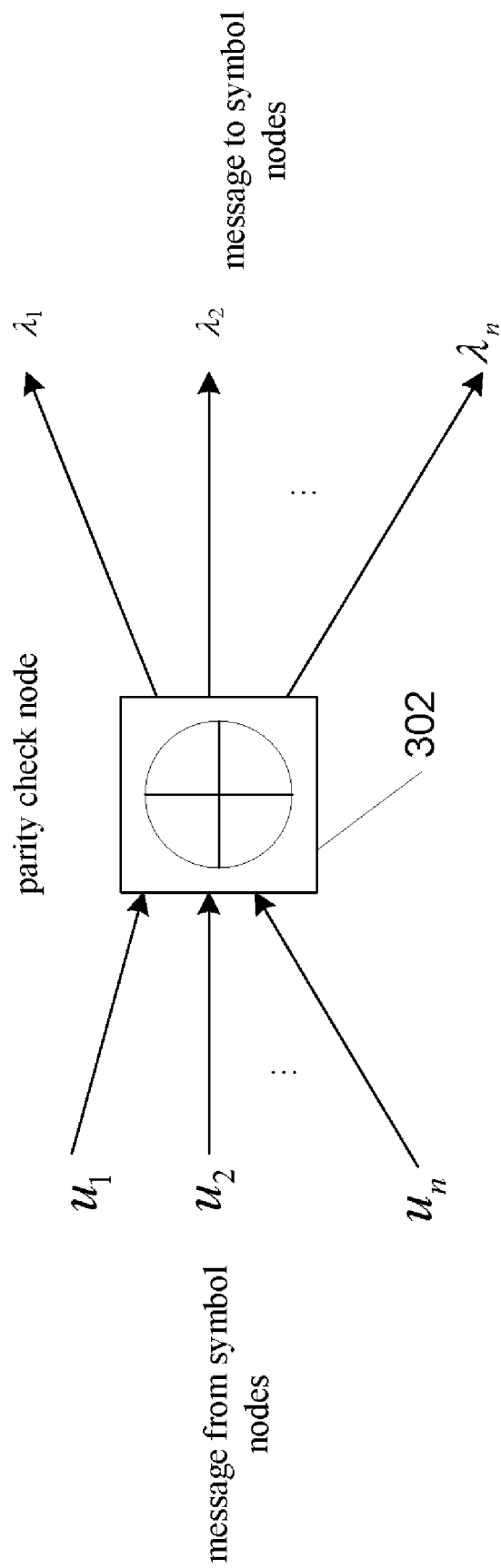
FIG. 3 is a diagram illustrating an exemplary parity node processor.

A check node processor 302 of degree n is shown in FIG. 3. At each iteration, the outgoing soft messages $\{\lambda_i, i=1, 2, \ldots n\}$ are updated with the incoming soft messages $\{u_i, i=1, 2, \ldots n\}$. The outgoing soft message is defined as the logarithm of the ratio of probability that the corresponding bit is 0 or 1.

With the standard sum-product algorithm, the outgoing message is determined as follows:

$$\lambda_i = 2\tanh^{-1} \prod_{\substack{j=1 \\ j \neq i}}^{n} \tanh\frac{u_j}{2}, i = 1, 2 \ldots n \qquad (1)$$

The outgoing soft messages are then fed back to the variable node processors for use in generating outputs $u_i$ during the next iteration; however, a soft message $\lambda_i$ based on a variable node output from a particular node are not returned to that node. Thus, the $j \neq i$ constraint in the following term of (1):

$$\prod_{\substack{j=1 \\ j \neq i}}^{n} \tanh\frac{u_j}{2}, i = 1, 2 \ldots n.$$

Figure 4:
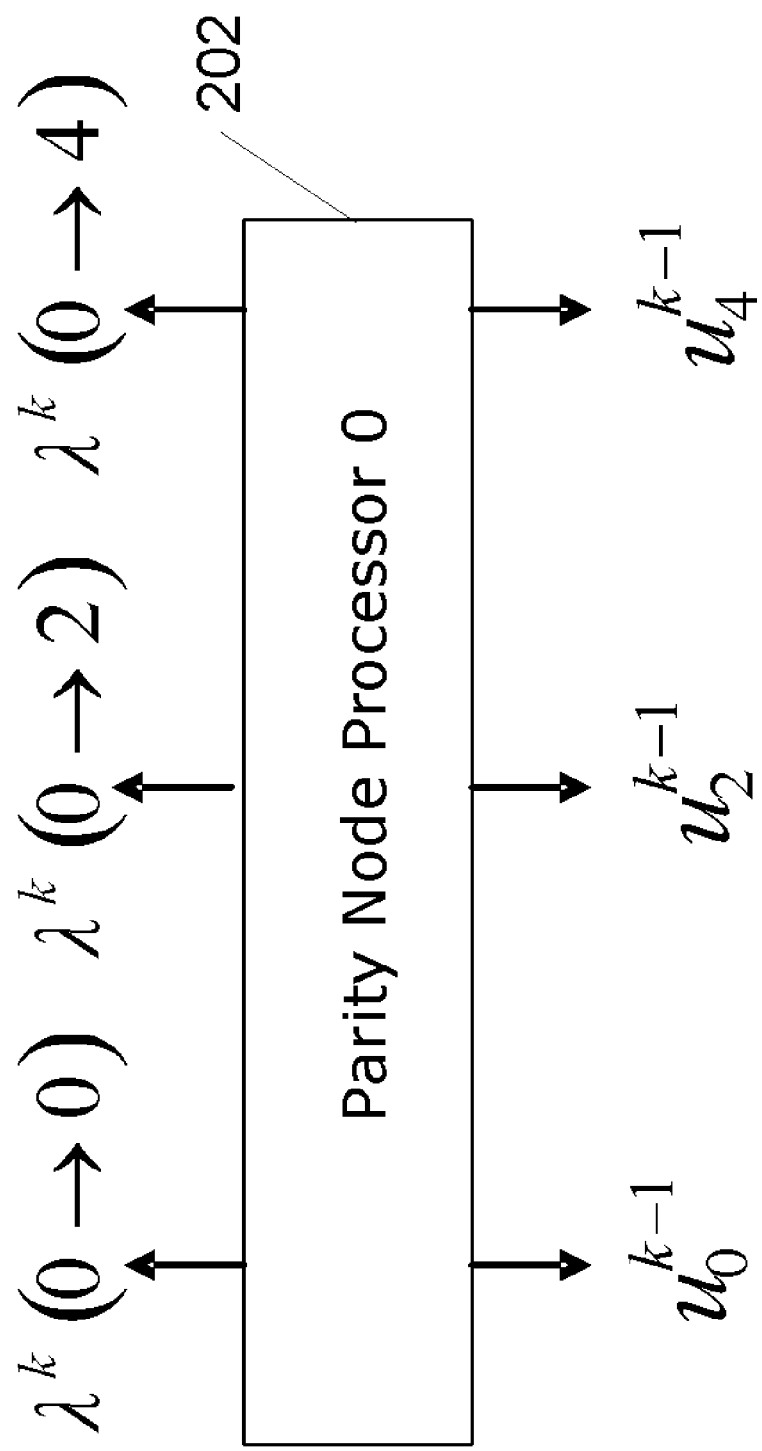
FIG. 4 is a diagram illustrating the operation of an exemplary parity node processor.

This can also be illustrated with the aide of FIG. 4, which is a diagram illustrating the operation of parity node processor 202. First, the LDPC decoder will initialize the variable data bits $u_0, u_1, u_2 \ldots u_6$ of variable node processors 208, 210, 212, 214, 216, and 218 with $r_0, r_1, r_2, \ldots r_6$. Referring to FIG. 4, $u_0^{k-1}, u_2^{k-1}$, and $u_4^{k-1}$ are the variable messages sent from variable nodes 208, 212, and 216 to parity node processor 202. Parity node processor 202 operates on these messages and computes its messages $\lambda^k$. For example, $\lambda^k(0 \to 2)$ represents the message sent from parity node 202 to variable node 212 at the kth iteration.

The messages produced by parity node processor 202 can be defined using the following equations:

$$\lambda^k(0 \to 0) = 2\tanh^{-1}\left[\tanh\left(\frac{u_2^{k-1}}{2}\right)\tanh\left(\frac{u_4^{k-1}}{2}\right)\right] \qquad (2)$$

$$\lambda^k(0 \to 2) = 2\tanh^{-1}\left[\tanh\left(\frac{u_0^{k-1}}{2}\right)\tanh\left(\frac{u_4^{k-1}}{2}\right)\right]$$

$$\lambda^k(0 \to 4) = 2\tanh^{-1}\left[\tanh\left(\frac{u_0^{k-1}}{2}\right)\tanh\left(\frac{u_2^{k-1}}{2}\right)\right]$$

Thus parity node processor 202 can be configured to implement the above equations (2). The soft messages produced by the parity nodes, e.g., parity node 202, are then fed back to variable nodes 208, 210, 212, 214, 216, and 218, for use in the next iteration.

Figure 5:
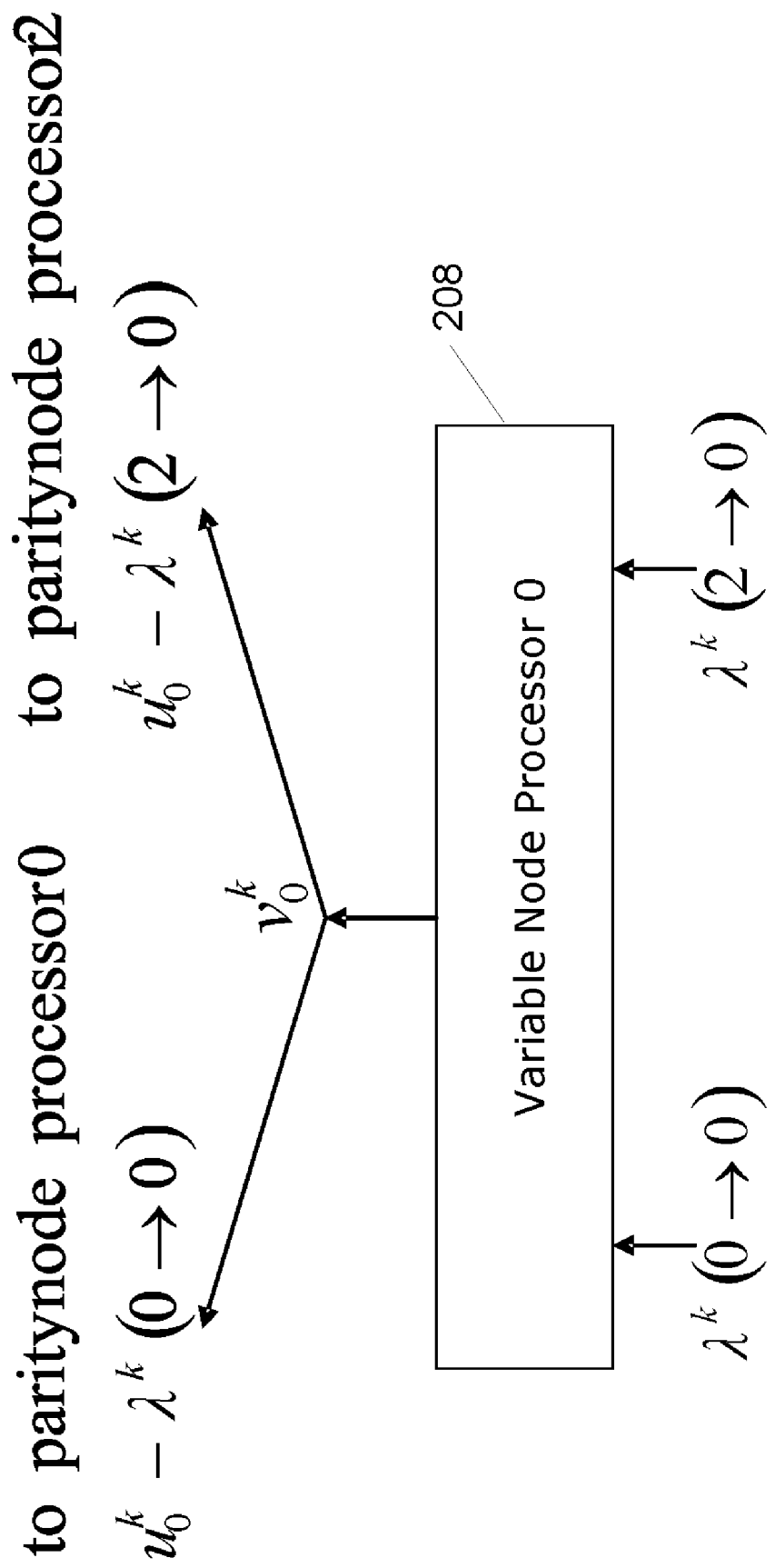
FIG. 5 is a diagram illustrating the operation of an exemplary variable node processor.

For example, FIG. 5 is a diagram illustrating the operation of variable node processor 208. Referring to FIG. 5, variable node processor 208 receives as inputs messages from parity node processors 202 and 206 and produces variable messages to be sent back to the same parity node processors 202 and 206. In the example of FIG. 4 and FIG. 5, hard decisions are taken on the multilevel variable $u_n^k$ and checked to see if they meet the parity node equations defined above. If there is a match, or if a certain defined number of iterations is surpassed, then the decoder can be stopped.

Variable node processor 208 can be configured to implement the following equation:

$$u_0^k = u_{ch,0} + \lambda^k(0 \to 0) + \lambda^k(2 \to 0), \qquad (3)$$

where $u_{ch,0}$ is the message from the channel, which does not change with each iteration It will be understood that the decoder described above can be implemented using hardware and/or software configured appropriately and that while separate parity check processors and variable node processors are described, these processors can be implemented by a single processor, such as a digital signal processor, or circuit, such as an Application Specific Integrated Circuit (ASIC); however, as mentioned above, implementation of a LDPC processor such as that described with respect to FIGS. 2-5 can result in large complexity, stringent memory requirements, and interconnect complexity that can lead to bottlenecks. These issues can be exacerbated if multiple data rates are to be implemented. In other words, practical implementation if such a decoder can be limited.

As noted above, the sum-product algorithm of equation (1) can be prohibitive in terms of practical and cost effective implementation. Approximations have been proposed with the aim of reducing this complexity. For example, it can be shown that (4) is equivalent to (1):

$$\lambda_i = u_1 \oplus u_2 \oplus \ldots \oplus u_n, \quad (4)$$

where the operator $\oplus$ is defined as:

$$x \oplus y \triangleq \ln \frac{1 + e^{x+y}}{e^x + e^y}. \quad (5)$$

Using the approximation formula:

$$e^x + e^y \approx \max(e^x, e^y) = e^{\max(x,y)}. \quad (6)$$

Or equivalently, $$\ln(e^x + e^y) \approx \max(x, y) \quad (7)$$

in both numerator and denominator of (5), then the following can be obtained:

$$x \oplus y \approx \max(0, x+y) - \max(x, y) \quad (8)$$
$$= \text{sgn}(x)\text{sgn}(y)\min(|x|, |y|).$$

Repeatedly substituting (8) into (4), the min-sum algorithm (MSA) can be obtained as follows:

$$\lambda_i \approx \prod_{j \neq i} \text{sgn}(u_j) \times \min_{j \neq i}(|u_j|) \quad i = 1, 2, \ldots n \quad (9)$$

It will be apparent that equation (9) is much simpler to implement than (1) or (4), but the cost for this simplification is a grave performance penalty, generally about 0.3~0.4 dB, depending on the specific code structure and code rate. To reduce such performance loss, some modifications have been proposed. For example, the performance loss of MSA comes from the approximation error of (9) relative to (1). Accordingly, to improve the performance loss, the approximation error should be reduced. It can be shown that (9) is always larger than (1) in magnitude. Thus, normalized-MSA and offset-MSA use scaling or offsetting to force the magnitude be smaller.

With the normalized min-sum algorithm, (9) is scaled by a factor $\alpha$:

$$\lambda_i \approx \alpha \left\{ \prod_{j \neq i} \text{sgn}(u_j) \times \min_{j \neq i}(|u_j|) \right\}, \quad (10)$$

where $0 < \alpha \leq 1$.

The offset min-sum algorithm reduces the magnitude by a positive constant $\beta$:

$$\lambda_i \approx \prod_{j \neq i} \text{sgn}(u_j) \cdot \max\left(\min_{j \neq i}(|u_j|) - \beta, 0\right) \quad (11)$$

But these approaches again increase the complexity. Thus, as mentioned above, there is a constant trade-off between complexity and performance.

The embodiments described below use a new approach for the check nodes update in the decoding of LDPC codes. The approach is based on a new approximation of the SPA that can reduce the approximation error of the MSA and has almost the same performance as the SPA under both floating precision operation and fixed-point operation. As a result, the new approximation can be implemented in simple structures, the complexity of which is on par with MSA implementations.

The approximation error of MSA comes from the approximation error of equation (7). Note that equation (7) is coarse when x and y are close. MSA uses equation (7) in both numerator and denominator of equation (5). If the value of |x| and |y| is close, then either the numerator or the denominator can introduce large approximation error. Thus, to improve the accuracy of the outgoing message, equation (7) can be used in (5) only when the numerator or denominator of (5) will produce a small approximation error.

For example, when both x and y have the same sign, then using the approximation $1 + e^{x+y} \approx \max(e^0, e^{x+y})$ in the numerator will produce better results than using $e^x + e^y \approx e^{\max(x,y)}$ in the denominator. Similarly, when x and y have opposite signs, then only approximating the denominator of (5) using $e^x + e^y \approx e^{\max(x,y)}$ can produce better results. Thus, a better approximation of (5), for x, y>0, can be generated using the following:

$$x \oplus y \approx \ln \frac{e^{x+y}}{e^x + e^y} = -\ln(e^{-x} + e^{-y}). \quad (12)$$

For all combinations of the signs of x and y, the following general expression can be used:

$$x \oplus y \approx -\text{sgn}(x)\text{sgn}(y)\ln(e^{-|x|} + e^{-|y|}) \quad (13)$$

Iteratively substituting (13) into (4), produces:

$$\lambda_i = -\prod_{\substack{j=1 \\ j \neq i}}^{n} \text{sgn}(u_j) \times \ln\left(\sum_{\substack{j=1 \\ j \neq i}}^{n} e^{-|u_j|}\right). \quad (14)$$

Note that (14) only holds when $$\sum_{j \neq i} e^{-|u_j|} < 1.$$

If this condition is not satisfied, then the results can be limited to 1, resulting in the following.

$$\lambda_i = -\prod_{\substack{j=1 \\ j \neq i}}^{n} \text{sgn}(u_j) \times \ln\left(\min\left(\sum_{\substack{j=1 \\ j \neq i}}^{n} e^{-|u_j|}, 1\right)\right). \quad (15)$$

Now, let $$A = \sum_{j=1}^{n} e^{-|u_j|},$$

then (15) can be expressed as:

$$\lambda_i = -\prod_{j=1, j\neq i}^{n} \text{sgn}(u_j) \times \ln(\min(A - e^{-|u_i|}, 1)) \quad (16)$$

$$= -\prod_{j=1, j\neq i}^{n} \text{sgn}(u_j) \times \min\{\ln(A - e^{-|u_i|}), 0\}.$$

The sign of (16) can be realized in the same way as in a MSA implementation, e.g., with binary ex-or logic circuit. The kernel of the approximation has the invertibility property, which allows the computation of the aggregate soft messages first, followed by intrinsic back-out to produce extrinsic updates.

Figure 6:
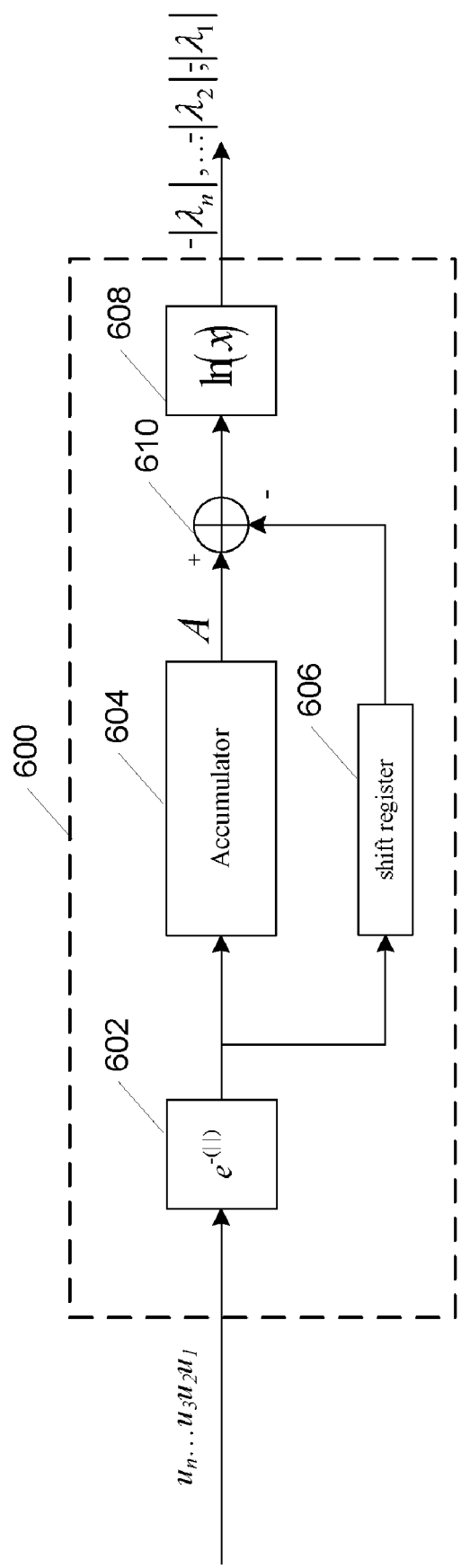
FIG. 6 is a diagram illustrating an example parity node processor configured in accordance with one embodiment.
Figure 7:
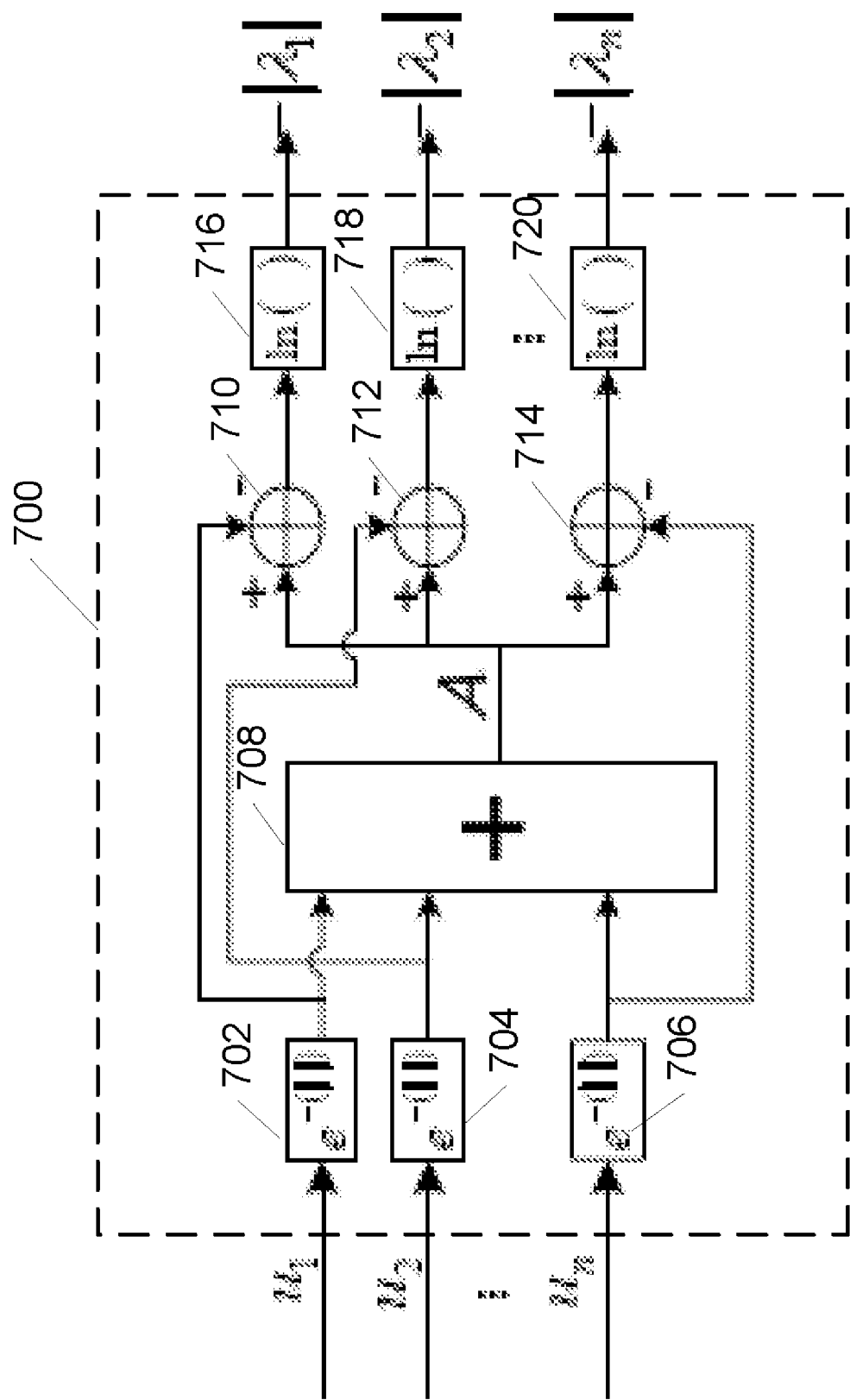
FIG. 7 is a diagram illustrating an example parity node processor configured in accordance with another embodiment.

The amplitude of equation (16) can be realized with a serial structure or a parallel structure shown in FIGS. 6 and 7 respectively. Thus, FIG. 6 is a diagram illustrating a serial implementation of a parity node processor 602. As can be seen, the variable node outputs are first processed by processing block 602 and then accumulated in accumulator 604. Each input is then stored in shift register 606 and subtracted from the output of accumulator 604 in adder 610. The natural log of the resulting difference is then taken in processing block 608 in order to produce the soft outputs.

FIG. 7 is a diagram illustrating a parallel implementation of a parity node processor 700. Here, the inputs from the variable node processors are processed in parallel in processing blocks 702, 704, and 706 and then summed in summer 708. Each input, is then subtracted from the output of summer 708 in parallel in adders 710, 712, and 714. The natural logs of the outputs of adders 710, 712, and 714 are then taken in parallel in processing blocks 716, 718, and 720 to produce the soft outputs.

Both structures 600 and 700 have the same computation load. Serial structure 600 requires smaller hardware size, but needs 2n clock cycles to get all outgoing soft messages. Parallel structure 700 requires only 1 clock cycle, but needs larger hardware size than serial structure 600. Parallel structure 700 is attractive when the decoding speed is the primary concern. It will be understood that the exponential and logarithm operations in FIGS. 6 and 7 can be realized in any way, such as look-up tables, software, or hardware, etc.

The ln(•) operation can include the min (•,0) operation, which can be implemented by simply using the sign bit of the logarithm result to clear the output. In particular, if the logarithm is realized with look-up table, this can be done by simply setting the content of the table to 0 for all inputs greater than 1 or simply limiting the range of the address used to pick up the table content.

The implementations of FIGS. 6 and 7 can be included in a receiver such as receiver 110. Such a receiver can be included in a device configured to operate in a, e.g., wireless Wide Area Network (WAN) or Metropolitan Area Network (MAN), a wireless Local Area Network (LAN), or wireless Personal Area Network (PAN).

The computation complexity of the proposed implementations is similar to an MSA implementation. Table 1 is the comparison of the computation load for parity node processing for various decoding algorithm, where it has been assumed that SPA, MSA, normalized-MSA and offset-MSA are implemented in a known forward-backward manner.

TABLE 1

|  | $e^{()}$ | $\ln()$ | + | x |
|---|---|---|---|---|
| SPA Eq. (4) | 9(n − 2) | 6(n − 2) | 12(n − 2) | — |
| Eq. (14) | n | n | 2n − 1 | — |
| MSA Eq. (9) | — | — | 3(n − 2) | — |
| Normalized-MSA Eq. (10) | — | — | 3(n − 2) | n |
| Offset-MSA Eq. (11) | — | — | 4n − 6 | — |

Figure 8:
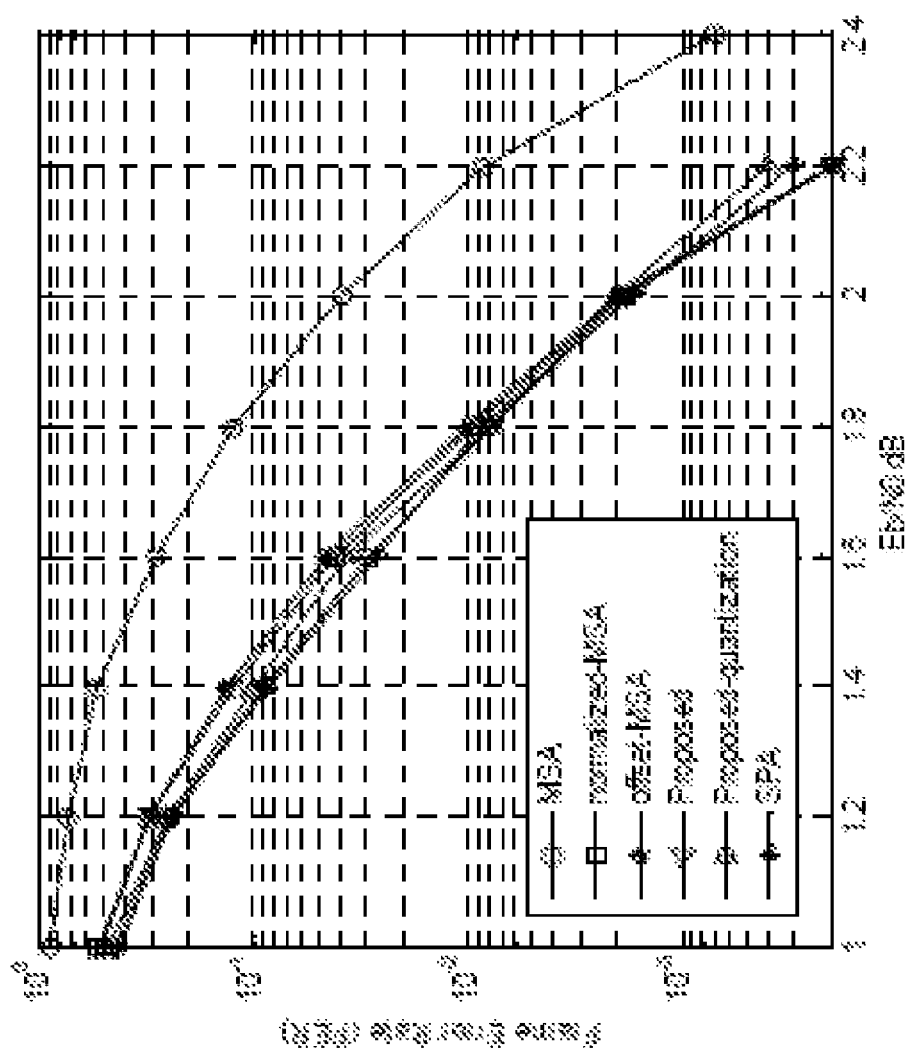
FIGS. 8 and 9 are graphs showing respectively the simulated frame error rate (FER) and bit error rate (BER) performance for the irregular, ½-rate LDPC codes defined in 802.16eD12 under AWGN channel for various decoding algorithms.
Figure 9:
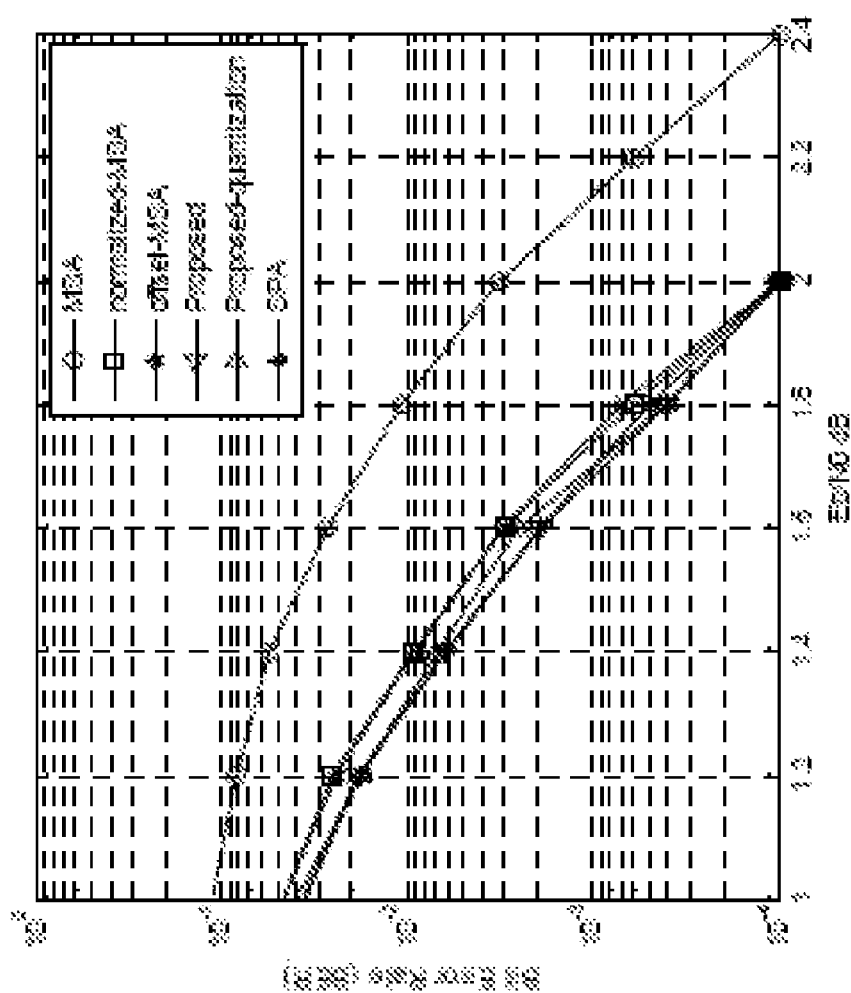

FIGS. 8 and 9 are graphs showing respectively the simulated frame error rate (FER) and bit error rate (BER) performance for the irregular, ½-rate LDPC codes defined in 802.16eD12 under AWGN channel for various decoding algorithms including SPA, the proposed algorithm under both floating and fixed-point operation, MSA, normalized-MSA and offset-MSA. With normalized-MSA and offset-MSA, a normalization factor of 0.8 is used and the offset factor as 0.15. The check node degree distribution of the code is $p(x) = 0.6667x^6 + 0.3333x^7$. The decoder use layered decoding with maximum iteration number as 30.

Figure 10:
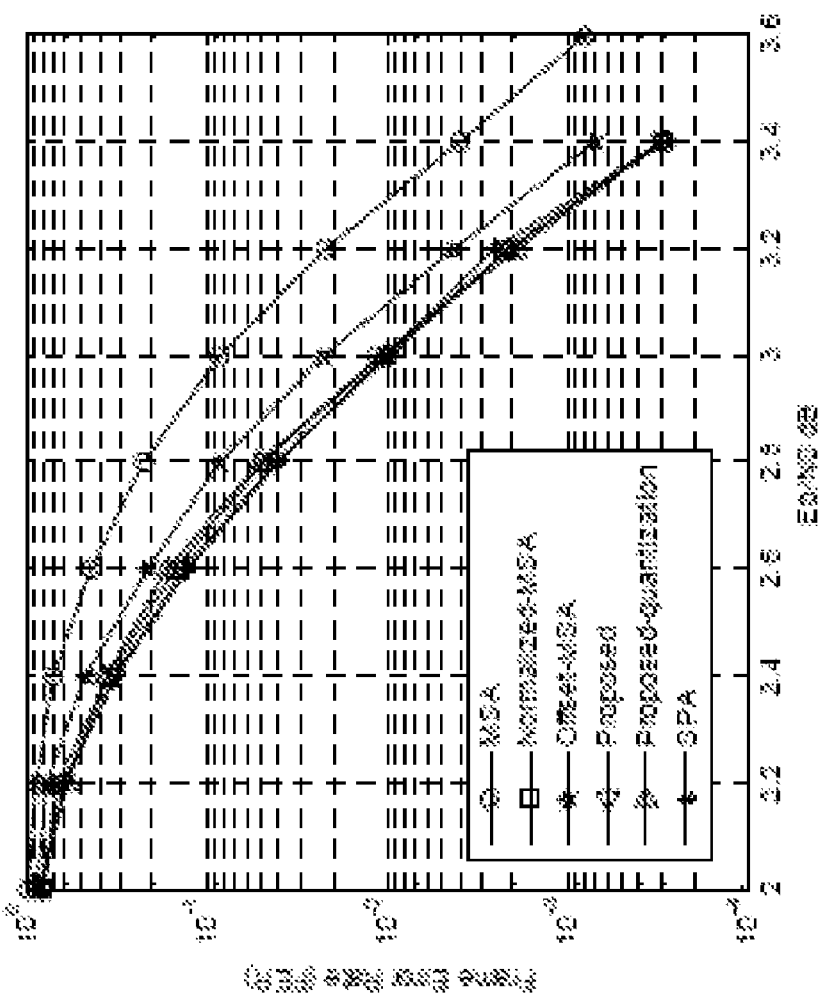
FIGS. 10 and 11 are graphs showing respectively the simulated frame error rate (FER) and bit error rate (BER) performance for the irregular, ¾-rate LDPC codes defined in 802.16eD12 under AWGN channel for various decoding algorithms.
Figure 11:
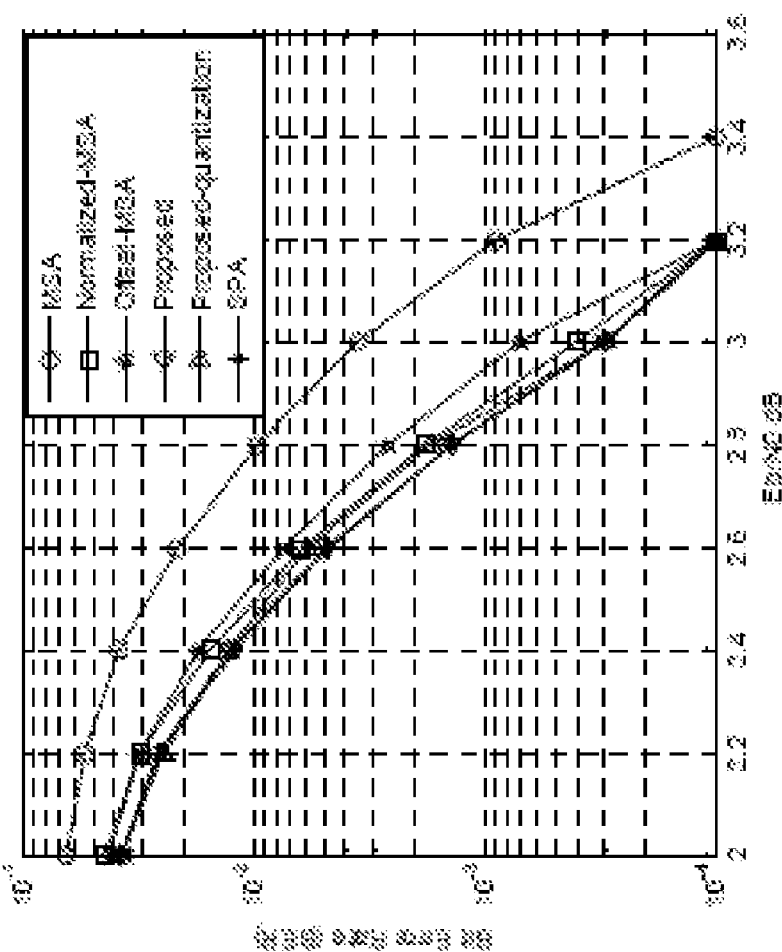

FIGS. 10 and 11 are graphs showing the corresponding simulation results for the irregular, ¾-rate LDPC codes with check node degree distribution as $p(x) = 0.8333x^{14} + 0.1667x^{15}$. All the curves are simulated with float-point operations except the curve labeled as "proposed-quantization," which is the results of an implementation of equation (16) with a fixed-point decoder. In the simulation of the fixed-point decoder, the channel inputs are quantized to 8 bits binary integers, where 1 bit is used for the sign and the other 7 bits for the absolute value.

In the simulations, the variable node updates are integer summations with results ranging from −128~+128. The exponential operation, e.g., in FIGS. 6 and 7, are implemented using a look up table with 128 entries each has 9 bits representing a quantized value in [0,1]. The summation and subtraction, e.g., in FIGS. 6 and 7, are 9 bits integer operations. The logarithm is a table with 512 entries, each of which has 7 bits representing the quantized absolute value to be sent to variable nodes together with sign bits.

It can be seen from the graphs of FIGS. 8-11 that implementation of equation (16) with floating operation can have almost the same performance as standard SPA, and performance that is better than that produced using MSA by 0.3-0.4 dB.

Moreover, although it can be challenging to meet the dynamic range requirements for the exp ( ) operation, the simulation results show that the fixed-point operation has hardly any performance loss relative to the floating operation. Note that the number of quantization bits can be greatly reduced with non-uniform quantization, with increased complexity. With non-uniform quantization, the size of the logarithm and exponential tables can be reduced, but these quantized values should be first mapped to the linearly quantized values before the operation of summation in FIG. 6.

Figure 12:
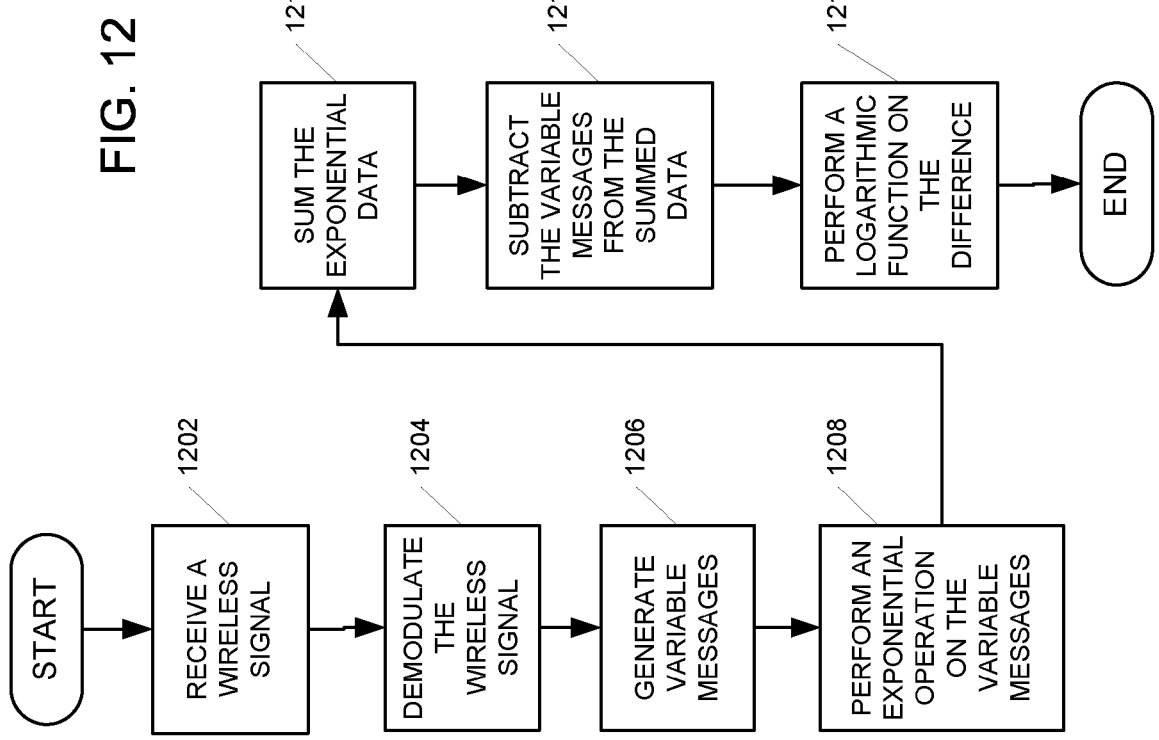
FIG. 12 is a flow chart illustrating an example method for performing LDPC decoding using the parity node processors of FIG. 6 or 7.

FIG. 12 is a flow chart illustrating an example method for performing LDPC decoding as described above. First in step 1202, a wireless signal can be received and the signal can be demodulated in step 1204. In step 1206, variable messages can be generated from the demodulated signal. An exponential operation can be performed on the variable messages in accordance with equation (16) in step 1208. In step 1210, the resulting exponential data can be summed and the variable messages can be subtracted from the summed data in step 1212, again in accordance with equation (16). Finally, and again in accordance with equation (16), then a logarithmic operation can be performed, in step 1214, on the difference produced in step 1212.

Accordingly, using the systems and method described above, the resources, i.e., complexity, required to implement a parity node can be reduced, while still maintaining a high degree of precision. In certain embodiments, the complexity can be reduced even further through degree reduction techniques. In other words, the number of inputs to the parity node can be reduced, which can reduce the resources required to implement the parity node. It should also be noted that in many parity node implementations, the sign and the absolute value of the outgoing soft message are calculated separately.

Figure 13:
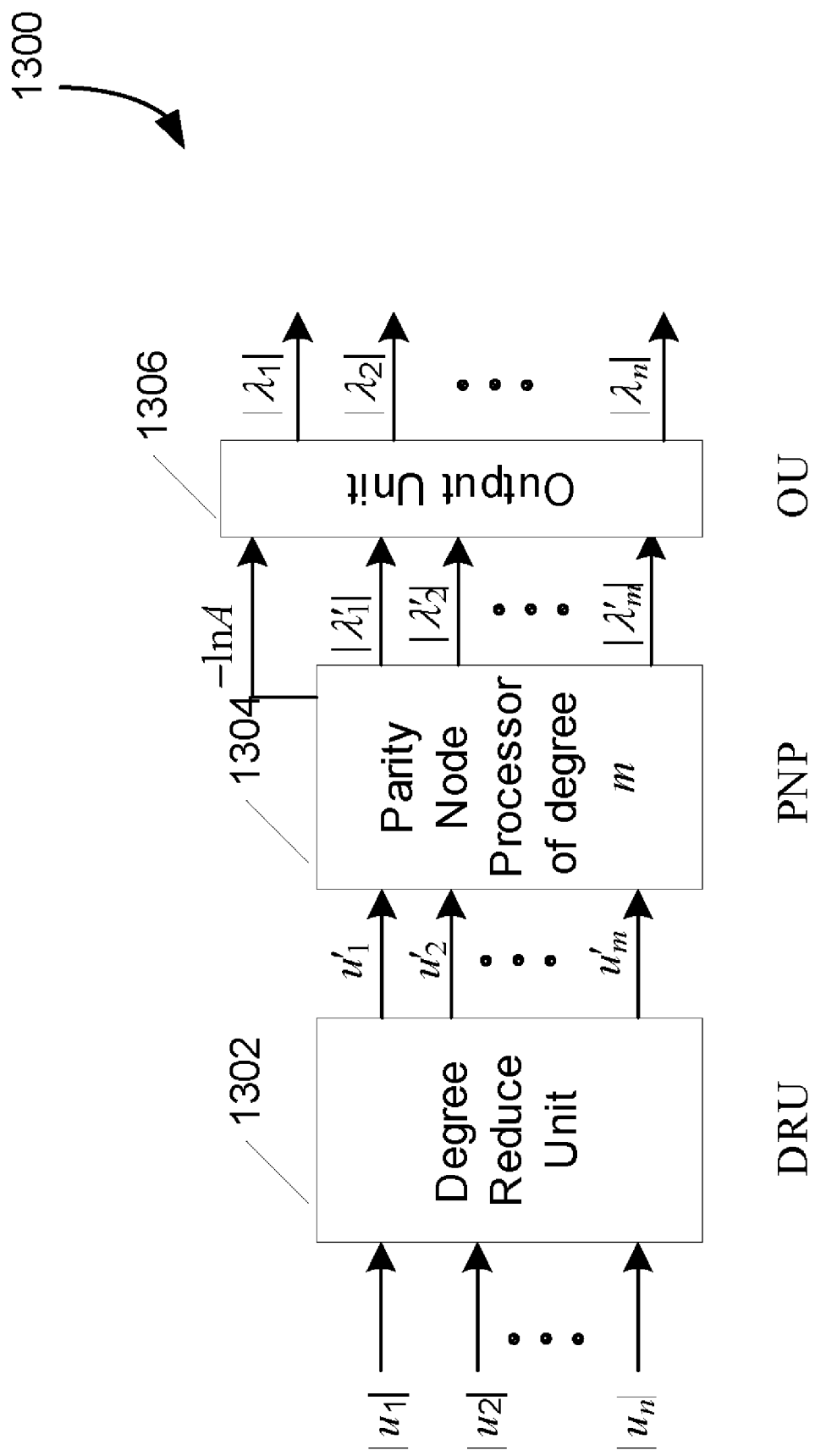
FIG. 13 is a diagram illustrating a portion of an example LDPC decoder that includes degree reduction in accordance with one embodiment.

FIG. 13 is a diagram illustrating a portion of an example LDPC decoder 1300 that includes degree reduction. In LDPC decoder 1300, the absolute value of variable messages $\{u_i, i=1,2...n\}$, i.e., $\{|u_1|, |u_2|, ..., |u_n|\}$, are first input to Degree Reduction Unit (DRU) 1302, which produces a reduced number of outputs $\{u'_1, u'_2, ..., u'_m\}$, where m<n. In other words, DRU 1302 is configured to select m inputs out of n total inputs, where normally, m<n. In certain embodiments, the inputs $\{u_i, i=1,2,...n\}$ with smallest value can be chosen. The selected inputs $\{u'_1, u'_2, ..., u'_m\}$ are then a subset of $\{|u_1|, |u_2|, ..., |u_n|\}$ such that all the elements in set $\{|u_1|, |u_2|, ..., |u_n|\} \setminus \{u'_1, u'_2, ..., u'_m\}$ cannot be smaller than any elements in $\{u'_1, u'_2, ..., u'_m\}$.

The outputs of DRU 1302 can then be provided to parity node processor 1304. Parity node processor 1304 can be implemented using either the serial configuration of FIG. 6 or the parallel configuration of FIG. 7.

Figure 14:
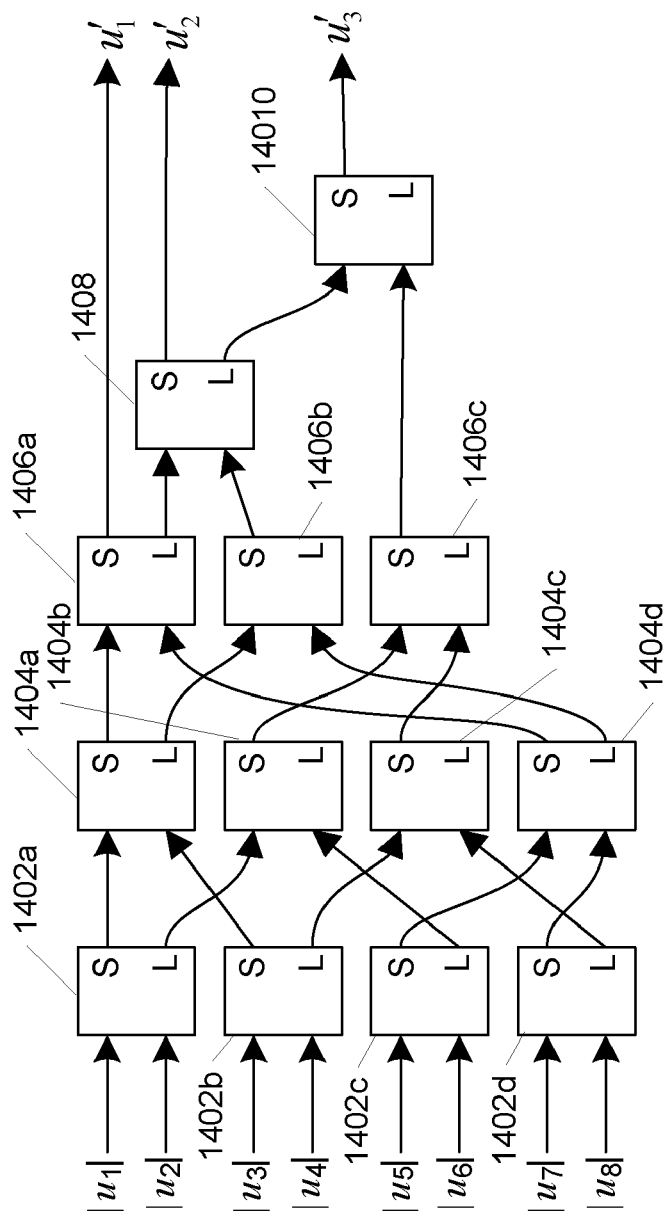
FIG. 14 is a diagram illustrating an example embodiment of a degree reducing unit that can be included in the LDPC decoder of FIG. 13 in accordance with one embodiment.

Similarly, depending on the embodiment, DRU 1302 can be implemented in parallel or serial structures. FIG. 14 is diagram illustrating a parallel configuration for DRU 1302. In the example of FIG. 14, DRU 1302 comprises 12 comparators configured to reduce the degree from 8 to 3. In other words, 8 input variable messages are reduced to three output message to be based to parity node processor 1304. It will be understood, of course, that different input and output degrees can be accommodated depending on the requirements of a particular implementation. It will also be understood that the greater the degree reduction, the greater the reduction in complexity of parity node processor 1304; however, this can also lead to reduced precision. Accordingly, the level of degree reduction should be chosen to maximum resource savings and precision.

Figure 15:
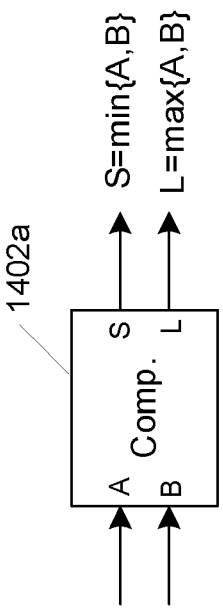
FIG. 15 is a diagram illustrating an example comparator that can be included in the degree reducing unit of FIG. 14.

An example, implementation for the comparators of FIG. 14 is illustrated in FIG. 15. As can be seen, the S output is the smaller of the two inputs, while the L output is the larger of the two.

In the example of FIG. 14, DRU 1302 is configured to select the smallest inputs. Thus, the comparators are configured to select the smallest input from each input pair. In this case, five levels of comparators are used to produce the 8 to 3 degree reduction. Comparators 1402a-1402d, select the smallest input from the input pairs. These are then compared to the largest inputs form the input pairs in the second level of comparators comprising comparators 1404a-1404d in the manner shown. One of the outputs is the dropped out and the remaining inputs are compared in the third level of comparators 1406a-1406c. two more outputs are then dropped and the remaining inputs are compared in level four, comparator 1408 and level five, comparator 1410.

Figure 16:
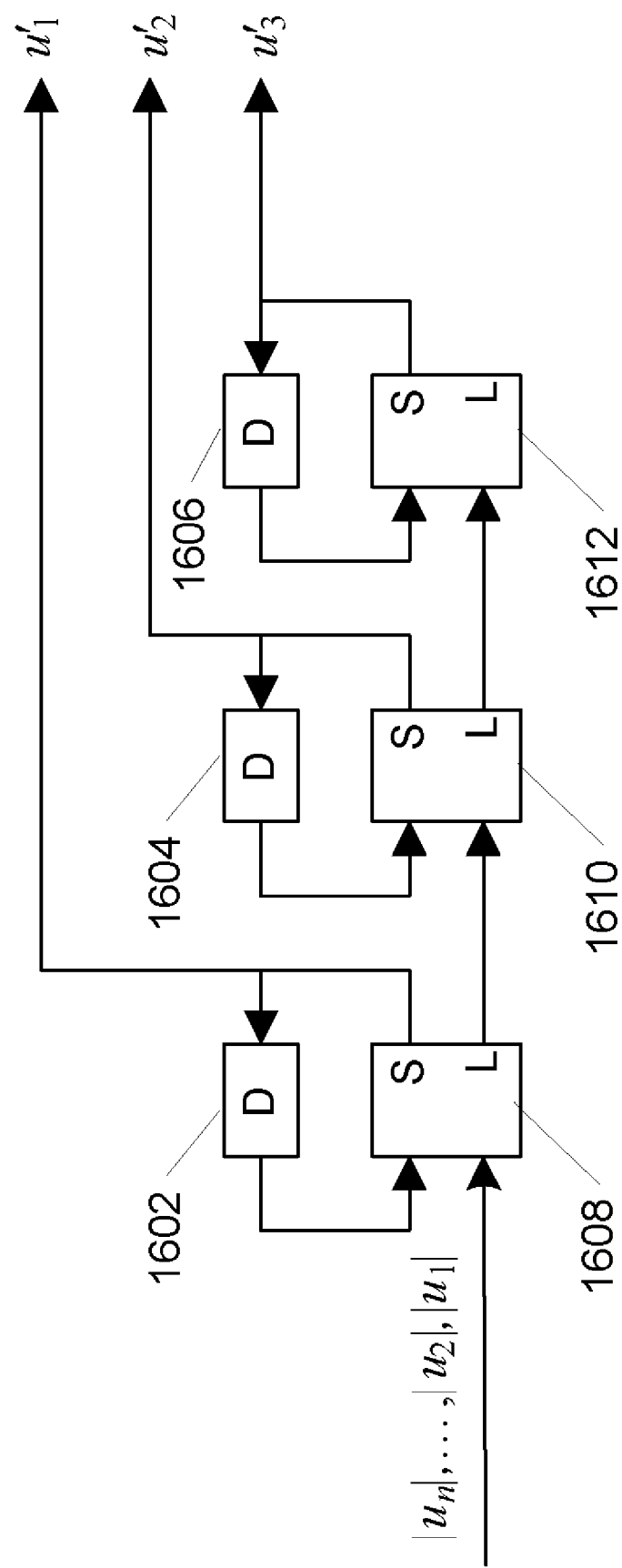
FIG. 16 is a diagram illustrating an example embodiment of a degree reducing unit that can be included in the LDPC decoder of FIG. 13 in accordance with another embodiment.

FIG. 16 is a diagram illustrating an example serial implementation of DRU 1302 in accordance with one embodiment. AS can be seen, in the example of FIG. 16, serial DRU 1302 reduces the degree from n to 3. In this example embodiment, DRU 1302 comprises serial comparators, e.g., comparators 1608, 1610, and 1612, which can be implemented as illustrated in FIG. 15 and described above. Delay units 1602, 1604, and 1606 are included and correspond to one clock cycle. The inputs $\{|u_1|, |u_2|, ..., |u_n|\}$ arrive sequentially, one input for one clock cycle.

Parity node processor 1304 can be configured to calculate the absolute value of outgoing messages with equation (16), i.e., the second term of equation (16). In other words, the sign and absolute value for equation (16) can be determined separately using the following:

$$\lambda_i = \prod_{j=1, j \neq i}^{n} sgn(u_j) \times \max\{-\ln(A - e^{-|u_i|}), 0\} \quad (16)$$

$$sgn(\lambda_i) = \prod_{j=1, j \neq i}^{n} sgn(u_j) = sgn(u_i)B \quad (17)$$

$$|\lambda_i| = \max\{-\ln(A - e^{-|u_i|}), 0\} \quad (18)$$

Thus, parity node processor 1304 can be used to calculate the absolute value in accordance with equation (18) for a check node of degree m. Parity node processor 1304 can be implemented as a serial or parallel parity node processor as described above.

Output unit (OU) 1306 can be configured to simply connect the outputs of parity node processor 1304, i.e., $\{|\lambda'_1|, |\lambda'_2|, ..., |\lambda'_m|\}$, to the output ports $\{|\lambda_1|, |\lambda_2|, ..., |\lambda_n|\}$. For example, suppose there are 8 inputs $\{|u_1|, |u_2|, ..., |u_8|\}$ and DRU 1302 select m=3 of them. The selection results depends on the specific data value of $\{|u_1|, |u_2|, ..., |u_8|\}$. Suppose that for some specific inputs, the selection result is $\{u'_1=|u_2|, u'_2=|u_8|, u'_3=|u_5|\}$, then OU 1306 should connect $|\lambda'_1|, |\lambda'_2|$ and $|\lambda'_3|$ to $|\lambda_2|, |\lambda_8|$ and $|\lambda_5|$, respectively and connect $-\ln A$ to $|\lambda_1|, |\lambda_3|, |\lambda_4|, |\lambda_6|, |\lambda_7|$.

For this to be feasible, OU 1306 should be configured to operate in coordination with DRU 1302. For example, if the k-th input of DRU 1302, i.e., $|u_k|$, is selected by DRU 1302 as the j-th input of parity node processor 1304, i.e., $u'_j$, then OU 1306 can be configured to correspondingly connect the j-the output of parity node processor 1304 to $|\lambda_k|$.

It should be noted that while a parallel implementation of DRU 1302 can be paired with a parallel implementation of parity node processor 1304, and that a serial implementation of DRU 1302 can be paired with a serial implementation of parity node processor 1304, such us not required. In other words, a parallel implementation of DRU 1302 can be paired with a serial implementation of parity node processor 1304 and vice versa. Moreover, it may be better, depending on the requirements of a particular implementation to forgo the inclusion of DRU 1302 and OU 1306. For example, if decoding speed is of the most concern, then a combination of a parallel DRU 1302 and a parallel parity node processor 1304 can be the best choice. On the other hand, if hardware size and resources is the most important issue, then a serial parity node processor 1304 without any DRU 1302 or OU 1306 can be preferred. If the LPDC decoder is implemented, e.g., with a Digital Signal Processor (DSP), as in the Software Defined Radio (SDR) terminals, a serial DRU 1302 and a serial parity node processor can be preferred because it provides the least decoding delay.

Figure 17:
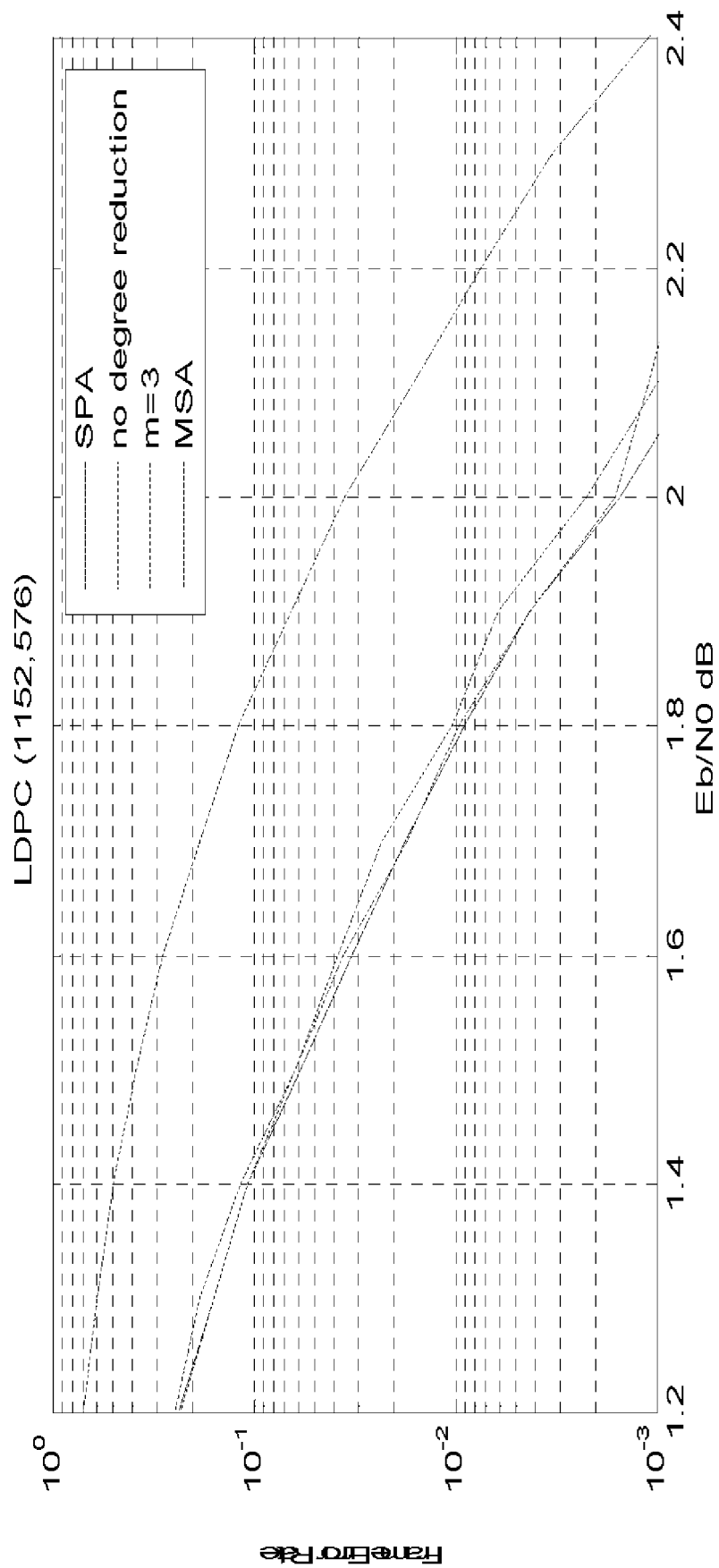
FIG. 17 is a graph illustrating the FER performance for the LDPC decoder of FIG. 13 with a degree reduction of ⅚ and ⅞.

FIG. 17 is a diagram illustrating simulation results for the decoder of FIG. 13, illustrating that such an embodiment can reduce the degree to 3 and only cause a performance loss less than 0.05 dB compared with SPA. The check node degree of the simulated LDPC code is 6 and 7. Similar performance can be observed for ¾ rate LDPC code whose check node degree is 14 and 15.

Table 2 illustrates the LDPC complexity comparison with the degree reduction of FIG. 13 and without. The data in table 2 is for n=8 and m=3. The "comparison" operation is normally less complex than the "Add" operation, thus the overall complexity with degree reduction is much less than without.

TABLE 2

|  | exp | log | Add | Comparison |
|---|---|---|---|---|
| Without degree reduction | 8 | 8 | 15 |  |
| With degree reduction | 3 | 4 | 4 | 13 |

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A receiver, comprising:
   a demodulator configured to receive a wireless signal comprising an original data signal, to remove a carrier signal from the wireless signal and to produce a received signal; and
   a Low Density Parity Check (LDPC) processor coupled with the demodulator, the LDPC processor configured to recover the original data signal according to the received signal, the LDPC processor comprising:
     a plurality of variable node processors configured to generate variable messages based on the received signal;
     a parity node processor coupled with the plurality of variable node processors, the parity node processor configured to implement an approximation of a sum product algorithm (SPA) based on signs of the variable messages resulting in soft messages representing estimates of the variable messages; and
     a degree reducing unit coupled with the plurality of variable node processors, the degree reducing unit configured to receive the variable messages and to reduce the degree of the variable messages prior to generation of the soft messages.

2. The receiver of claim 1, wherein the parity node processor is configured to implement the following:

$$\lambda_i = -\prod_{j=1, j\neq i}^{n} sgn(u_j) \times \max\{\ln(A - e^{-|u_i|}), 0\},$$

where $\lambda_i$ represents the soft outputs, $u_j$ represents the variable messages, and $$A = \sum_{j=1}^{n} e^{-|u_j|}.$$

3. The receiver of claim 1, wherein the parity node processor comprises:
   a plurality of input processing blocks configured to receive the plurality of variable messages in parallel and perform an exponential operation on the variable messages in order to generate exponential terms for use in generating the soft messages;
   a summer coupled with the plurality of input processing blocks, the summer configured to sum the exponential terms generated by the plurality of input processing blocks in order to generate sum terms for use in generating the soft messages;
   a plurality of adders coupled with the summer and the plurality of input processing blocks, the plurality of adders configured to subtract the exponential terms from the sum terms in order to generate a difference term for use in generating the soft messages; and
   a plurality of output processing blocks coupled with the plurality of adders, the plurality of output processing blocks configured to perform a logarithm function on the outputs of the plurality of adders in order to produce the soft messages.

4. The receiver of claim 3, wherein the parity node processor further comprises a sign processing block coupled with the plurality of output processing blocks, the sign processing block configured to determine a sign associated with the outputs of the plurality of output processing blocks.

5. The receiver of claim 1, wherein the parity node processor comprises:
   an input processing block configured to serially receive the variable messages and perform an exponential operation on the variable messages in order to produce exponential terms for use in generating the soft messages;
   an accumulator coupled with the input processing block, the accumulator configured to accumulate the exponential terms in order to generate sum terms for use in generating the soft messages;
   a shift register coupled with the input processing block, the shift register configured to store the variable massages for one clock cycle;
   an adder coupled with the accumulator and the shift register, the adder configured to subtract the output of the shift register from the sum terms in order to produce difference terms for use in generating the soft messages; and
   an output processing block coupled with the adder, the output processing block configured to perform a logarithm function on the difference terms in order to generate the soft messages.

6. The receiver of claim 5, wherein the parity node processor further comprises a sign processing block coupled with the output processing block, the sign processing block configured to determine a sign associated with the output of the output processing block.

7. A LDPC decoder comprising:
   a parity node processor configured to generate soft messages that are estimates of variable messages received from a plurality of variable node processors, the parity node processor comprising:
     a plurality of input processing blocks configured to receive the variable messages in parallel and perform an exponential operation on the variable messages in order to generate exponential terms for use in generating the soft messages;
     a summer coupled with the plurality of input processing blocks, the summer configured to sum the exponential terms generated by the plurality of input processing blocks in order to generate sum terms for use in generating the soft messages;
     a plurality of adders coupled with the summer and the plurality of input processing blocks, the plurality of adders configured to subtract the exponential terms from the sum terms in order to generate a difference term for use in generating the soft messages; and a plurality of output processing blocks coupled with the plurality of adders, the plurality of output processing blocks configured to perform a logarithm function on the outputs of the plurality of adders in order to produce the soft messages; and a degree reducing unit coupled with a plurality of variable node processors, the degree reducing unit configured to receive the variable messages and to reduce the degree of the variable message prior to generation of the soft messages.

8. The LDPC decoder of claim 7, wherein the parity node processor further comprises a sign processing block coupled with the plurality of output processing blocks, the sign processing block configured to determine a sign associated with the soft messages.

9. The LDPC decoder of claim 8, wherein the sign processing block is implemented using a binary ex-or logic circuit; wherein the plurality of input processing blocks are implemented as look up tables, wherein the plurality of output processing blocks are implemented as look up tables.

10. An LDPC decoder comprising:

a parity node processor configured to generate soft messages that are estimates of variable messages received from a plurality of variable node processors, the parity node processor comprising:

an input processing block configured to serially receive the variable messages and perform an exponential operation on the variable messages in order to produce exponential terms for use in generating the soft messages;

an accumulator coupled with the input processing block, the accumulator configured to accumulate the exponential terms in order to generate a sum terms for use in generating the soft messages;

a shift register coupled with the input processing block, the shift register configured to store the variable massages for one clock cycle;

an adder coupled with the accumulator and the shift register, the adder configured to subtract the output of the shift register from the sum terms in order to produce difference terms for use in generating the soft messages; and an output processing block coupled with the adder, the output processing block configured to perform a logarithm function on the difference terms in order to generate the soft messages; and a degree reducing unit coupled with the plurality of variable node processors, the degree reducing unit configured to receive the variable messages and to reduce the degree of the variable message prior to generation of the soft messages.

11. The LDPC decoder of claim 10, wherein the parity node processor further comprises a sign processing block coupled with the output processing block, the sign processing block configured to determine a sign associated with the soft messages.

12. The LDPC decoder of claim 11, wherein the sign processing block is implemented using a binary ex-or logic circuit, and wherein the input processing block is implemented as a look up table, and wherein the output processing block is implemented as look up table.

13. A method for processing a received wireless signal using an LDPC decoder including a parity node processor and a degree reducing unit, the method comprising:

receiving the wireless signal;
removing a carrier signal from the wireless signal to produce a received signal;
generating variable messages from the received signal;
performing an exponential operation on the variable messages to generate exponential data;
summing the exponential data;
subtracting the variable messages from the summed exponential data to form a difference
performing a logarithmic operation on the difference;
receiving the variable messages at the degree reducing unit; and
reducing a degree of the variable messages.

14. The method of claim 13, wherein said summing the exponential data comprises accumulating the exponential data.

15. The method of claim 14, wherein said subtracting the variable messages from the summed exponential data comprises subtracting a time shifted version of a variable message from the accumulated exponential data.

16. A LDPC decoder comprising a parity node processor configured to generate soft messages that are estimates of variable messages received from a plurality of variable nodes, the LDPC decoder comprising:

a plurality of variable node processors configured to generate variable messages based on the received signal;

a degree reducing unit coupled with the plurality of variable node processors, the degree reducing unit configured to receive the plurality of variable messages and to reduce the degree of the variable messages prior to generation of the soft messages; and a parity node processor coupled with the degree reducing unit, the a parity node processor configured to implement an approximation of a sum product algorithm (SPA) based on the signs of the reduced degree variable messages resulting in soft outputs representing estimates of the variable messages.

17. The LDPC decoder of claim 16, wherein the parity node processor comprises:

a plurality of input processing blocks configured to receive the plurality of reduced degree variable messages in parallel and perform an exponential operation on the reduced degree variable messages in order to generate exponential terms for use in generating the soft messages;

a summer coupled with the plurality of input processing blocks, the summer configured to sum the exponential terms generated by the plurality of input processing blocks in order to generate sum terms for use in generating the soft messages;

a plurality of adders coupled with the summer and the plurality of input processing blocks, the plurality of adders configured to subtract the exponential terms from the sum terms in order to generate a difference term for use in generating the soft messages; and a plurality of output processing blocks coupled with the plurality of adders, the plurality of output processing blocks configured to perform a logarithm function on the outputs of the plurality of adders in order to produce the soft messages.

18. The LDPC decoder of claim 17, further comprising a output unit coupled with the parity node processor, the output unit comprising a plurality of output ports, the output unit configured to receive the soft messages and couple each of the soft messages to the appropriate output port.

19. The LDPC decoder of claim 18, further comprising a sign processing block coupled with the output unit, the sign processing block configured to determine a sign associated with the outputs of the output unit.

20. The LDPC decoder of claim 16, wherein the parity node processor comprises:
- an input processing block configured to serially receive the reduced degree variable messages and perform an exponential operation on the reduced degree variable messages in order to produce exponential terms for use in generating the soft messages;
- an accumulator coupled with the input processing block, the accumulator configured to accumulate the exponential terms in order to generate sum terms for use in generating the soft messages;
- a shift register coupled with the input processing block, the shift register configured to store the variable massages for one clock cycle;
- an adder coupled with the accumulator and the shift register, the adder configured to subtract the output of the shift register from the sum terms in order to produce difference terms for use in generating the soft messages; and
- an output processing block coupled with the adder, the output processing block configured to perform a logarithm function on the difference terms in order to generate the soft messages.

21. The LDPC decoder of claim 20, further comprising a output unit coupled with the parity node processor, the output unit comprising a plurality of output ports, the output unit configured to receive the soft messages and couple each of the soft messages to the appropriate output port.

22. The LDPC decoder of claim 21, further comprising a sign processing block coupled with the output unit, the sign processing block configured to determine a sign associated with the outputs of the output unit.

* * * * *